US007923746B2

(12) United States Patent
Tsai et al.

(10) Patent No.: US 7,923,746 B2
(45) Date of Patent: Apr. 12, 2011

(54) LIGHT EMITTING DIODE PACKAGE STRUCTURE AND METHOD FOR FABRICATING THE SAME

(75) Inventors: Yao-Jun Tsai, Taoyuan County (TW); Chen-Peng Hsu, Kaohsiung (TW); Chao-Wei Li, Taipei (TW); Hung-Lieh Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/126,935

(22) Filed: May 26, 2008

(65) Prior Publication Data
US 2009/0230417 A1    Sep. 17, 2009

(30) Foreign Application Priority Data

Mar. 12, 2008 (CN) .......................... 2008 1 0083769

(51) Int. Cl.
*H01L 33/48* (2010.01)
(52) U.S. Cl. .................................. 257/99; 257/E33.058
(58) Field of Classification Search .................... 257/40, 257/79–82, 88, 98–100, 741, 749, 773, 786, 257/791, E33.059, E33.06, E33.058; 438/48, 438/22, 25–26, 69; 331/485–486, 499, 502–504, 331/506, 511–512
See application file for complete search history.

(56) References Cited

U.S. PATENT DOCUMENTS

| 5,528,474 | A | 6/1996 | Roney et al. |
| 5,857,761 | A | 1/1999 | Abe et al. |
| 6,650,044 | B1 * | 11/2003 | Lowery .......................... 313/502 |
| 7,061,022 | B1 | 6/2006 | Pham et al. |
| 2004/0041159 | A1 * | 3/2004 | Yuri et al. ........................ 257/79 |
| 2006/0157721 | A1 | 7/2006 | Tran et al. |
| 2007/0001190 | A1 | 1/2007 | Kim et al. |
| 2007/0121327 | A1 | 5/2007 | Chen et al. |

FOREIGN PATENT DOCUMENTS

| CN | 1487605 | 4/2004 |
| CN | 200972865 | 11/2007 |
| TW | I256745 | 5/2008 |

OTHER PUBLICATIONS

"1st Office Action of China Counterpart Application" issued on May 21, 2010, p.1-p.6.

* cited by examiner

*Primary Examiner* — Evan Pert
(74) *Attorney, Agent, or Firm* — Jianq Chyun IP Office

(57) ABSTRACT

The present invention discloses a light emitting diode (LED) package structure, which includes a carrier, a first protrusion, a LED chip, and an adhesion layer. The first protrusion is disposed on the carrier and has a first opening to expose the carrier, wherein the first protrusion is formed by a thermal conductive material. The LED chip is disposed in the first opening on the carrier, and a ratio between a width of the first opening and a width of the LED chip is 1~1.5. The adhesion layer is disposed between the LED chip and the carrier to bond the LED chip to the carrier.

13 Claims, 11 Drawing Sheets

800

900

LIGHT EMITTING DIODE PACKAGE STRUCTURE AND METHOD FOR FABRICATING THE SAME

CROSS-REFERENCE TO RELATED APPLICATION

This application claims the priority benefit of Chinese application serial no. 200810083769.9, filed on Mar. 12, 2008. The entirety of the above-mentioned patent application is hereby incorporated by reference herein and made a part of this specification.

BACKGROUND OF THE INVENTION

1. Field of the Invention

The present invention relates to a light emitting diode package structure, and particularly relates to a light emitting diode package structure having high thermal conduction efficiency.

2. Description of Related Art

In recent years, luminescence efficiency of light emitting diodes (LED) has been constantly improved. Consequently, fluorescent lamps and incandescent bulbs are gradually replaced with LEDs in some fields, such as scanning light source which requires high speed response, back or front light source of a liquid crystal display (LCD), automobile dashboard illumination, traffic signs, and general illumination devices. Typical LEDs are usually semiconductor devices which use III-V compounds, such as GaP, GaAs, and so on. LEDs convert electrical energy into light. When an electric current is applied to a semiconductor device with the aforesaid compounds, energy is released in the form of light through the combination of electron and electron hole. LEDs have advantages, such as faster response (about $10^{-9}$ S), smaller size, lower power consumption, less pollution, higher reliability, and capability for mass production. Accordingly, LEDs are widely applied in many fields.

FIG. 1 is a schematic cross-sectional view depicting a conventional light emitting diode package structure. Referring to FIG. 1, a conventional light emitting diode package structure 100 consists of a LED chip 110, a carrier 120, a conductive lines 132, a conductive line 134, and a molding compound 140. Herein, the LED chip 110 is disposed on the carrier 120, and the conductive line 132 and the conductive line 134 electrically connect the LED chip 110 with the carrier 120 respectively. The molding compound 140 is disposed on the carrier 120 and covers the conductive line 132 and the conductive line 134. The LED chip 110 is applied voltage difference through the conductive line 132 and the conductive line 134, and thereby a light emitting layer 112 of the LED chip 110 emits light and generates heat.

It is noted that the carrier 120 and the molding compound 140 of the conventional light emitting diode package structure 100 have poor thermal conduction efficiency. Consequently, heat generated by the light emitting layer 112 of the LED chip 110 can not be released effectively. When a high electric current is applied, the LED chip 110 is easily damaged for being overheated. Hence, a conventional method, which uses a thermal conductive material, such as metal, to fabricate the carrier 120, is provided to improve the thermal conduction efficiency of a bottom 114 of the light emitting diode package structure 100. However, such a method does not improve the thermal conduction efficiency of a sidewall 116 of the LED chip 110.

SUMMARY OF THE INVENTION

The present invention provides a light emitting diode (LED) package structure, which comprises a carrier, a first protrusion, a LED chip, and an adhesion layer. Herein, the first protrusion is disposed on the carrier and has a first opening to expose the carrier, and the first protrusion is formed by a thermal conductive material. The LED chip is disposed in the first opening on the carrier, and a ratio between a width of the first opening and a width of the LED chip is 1 approximately, such that an inner sidewall of the first opening is attached to a sidewall of the LED chip. The adhesion layer is disposed between the LED chip and the carrier to bond the LED chip to the carrier.

The present invention provides a light emitting diode (LED) package structure, which comprises a carrier, a first protrusion, a LED chip, and an adhesion layer. Herein, the first protrusion is disposed on the carrier and has a first opening to expose the carrier, and the first protrusion is formed by a thermal conductive material. The LED chip is disposed in the first opening on the carrier, and a ratio between a width of the first opening and a width of the LED chip is larger than 1 and smaller than or equal to 1.5 such that a gap exists between a sidewall of the LED chip and an inner sidewall of the first opening. The adhesion layer is disposed between the LED chip and the carrier to bond the LED chip to the carrier.

The present invention provides a method for fabricating a light emitting diode package structure described as follows. First, a substrate having a first surface is provided. Then, an adhesion layer and a LED chip are disposed on the first surface of the substrate, wherein the adhesion layer is bonded between the LED chip and the substrate, and the LED chip comprises a second surface away from the substrate. Next, a first thermal-conductive material layer is formed on the first surface, wherein the first thermal-conductive material layer comprises a first opening to expose the LED chip, and an inner sidewall of the first opening is attached to a sidewall of the LED chip.

The present invention provides a method for fabricating a light emitting diode package structure described as follows. A substrate having a recess is provided. Then, an adhesion layer and a LED chip are disposed on a bottom of the recess, and the adhesion layer is bonded between the substrate and the LED chip. A ratio between a width of the recess and a width of the LED chip is larger than 1 and smaller than or equal to 1.5, and therefore a gap exists between a sidewall of the LED chip and an inner sidewall of the recess.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

To make the above purposes, features, and advantages of the present invention more comprehensible, preferable embodiments accompanied by drawings are detailed as follows.

DESCRIPTION OF EMBODIMENTS

Figure 2:
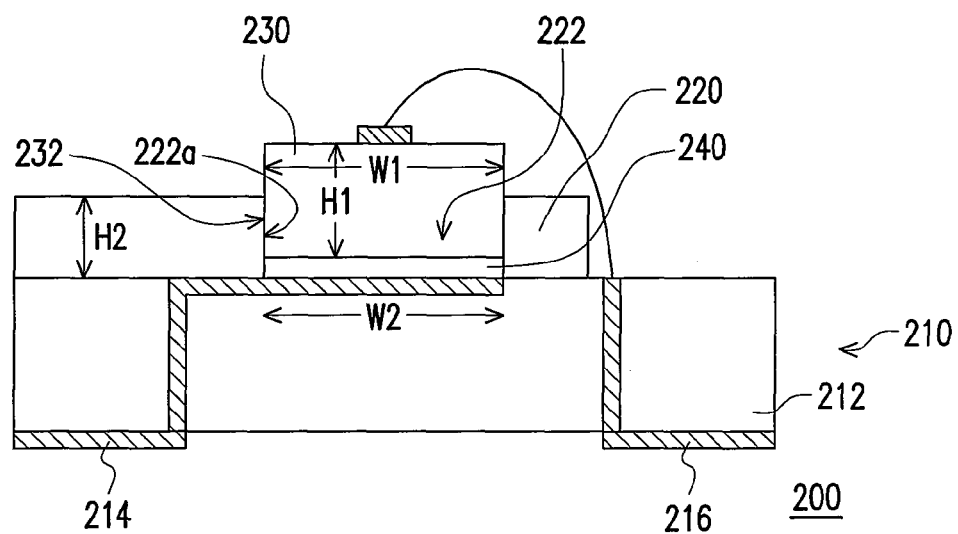
FIG. 2 is a schematic cross-sectional view depicting a light emitting diode package structure according to an embodiment of the present invention.

FIG. 2 is a schematic cross-sectional view depicting a light emitting diode package structure according to an embodiment of the present invention. Referring to FIG. 2, in this embodiment, a light emitting diode package structure 200 comprises a carrier 210, a first protrusion 220, a LED chip 230, and an adhesion layer 240. Herein, the first protrusion 220 is disposed on the carrier 210 and has a first opening 222 to expose the carrier 210. The first protrusion 220 may comprise a thermal-conductive material layer. In addition, a material of the thermal-conductive material layer may comprise gold, silver, copper, indium, titanium, zinc, aluminum, lead, tin, nickel, platinum, chromium, or a combination of alloys thereof. Certainly, in other embodiments, the first protrusion may comprise a stack of a plurality of thermal-conductive material layers. In addition, a material of the stack of thermal-conductive material layers may comprise gold, silver, copper, indium, titanium, zinc, aluminum, lead, tin, nickel, platinum, chromium, or a combination of alloys thereof. Furthermore, the carrier 210 may comprise a substrate 212, a first conductive structure 214, and a second conductive structure 216. The first conductive structure 214 and the second conductive structure 216 respectively pass through the substrate 212.

The LED chip 230 is disposed in the first opening 222 on the carrier 210. A ratio between a width W2 of the first opening 222 and a width W1 of the LED chip 230 is 1, and therefore an inner sidewall 222a of the first opening 222 is attached to a sidewall 232 of the LED chip 230. In this embodiment, the width W1 (the widest portion) of the LED chip 230 and the width W2 of the first opening 222 are referred in the same cross-section.

It is noted that the present invention is not intended to limit the relative heights of the first protrusion 220 and the LED chip 230. It is to say that a height H1 of the LED chip 230 may be larger than, smaller than, or equal to a height H2 of the first protrusion 220. In addition, the first conductive structure 214 and the second conductive structure 216 are electrically connected with the LED chip 230 respectively. The adhesion layer 240 is bonded between the LED chip 230 and the carrier 210 to bond the LED chip 230 to the carrier 210. A material of the adhesion layer 240 is, for example, silver paste, solder, glass, alloy, or other suitable thermal conductive materials. Hence, the adhesion layer 240 helps to improve the thermal conduction efficiency of the LED chip 230.

Figure 1:
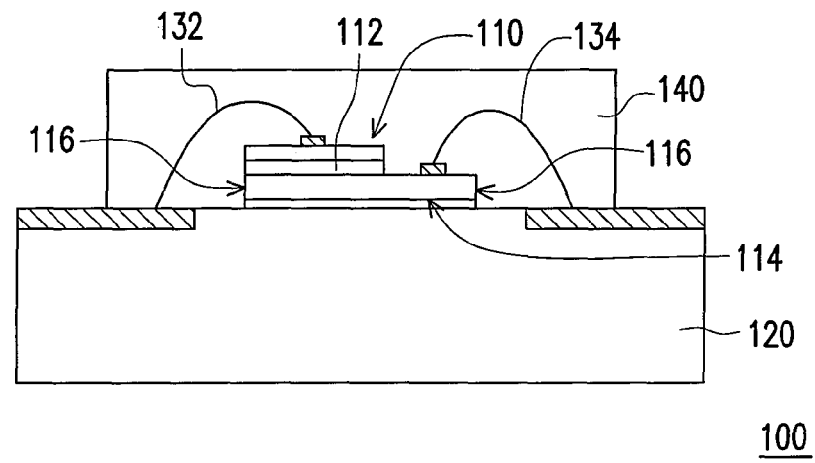
FIG. 1 is a schematic cross-sectional view depicting a conventional light emitting diode package structure.

In view of the above, the light emitting diode package structure 200 in this embodiment comprises the first protrusion 220 formed by a thermal conductive material, and the first protrusion 220 is attached to the sidewall 232 of the LED chip 230. Moreover, compared with a conventional carrier 120 (referring to FIG. 1), the first protrusion 220 is closer to a light emitting layer (not shown) of the LED chip 230. Consequently, the first protrusion 220 in this embodiment helps to increase the thermal conduction efficiency of the sidewall 232 of the LED chip 230, and release the heat generated by the light emitting layer of the LED chip 230. Therefore, the first protrusion 220 in this embodiment helps the light emitting diode package structure 200 to prevent reducing light emitting efficiency or damaging the LED chip 230.

The heat generated by the LED chip within the light emitting diode package structure in this embodiment is removed through the first protrusion attached to the sidewall of the LED chip so as to enhance the thermal conduction efficiency of the light emitting diode package structure. Persons skilled in this art may make some modifications without departing from the spirit and scope of the present invention. In addition, a variety of the light emitting diode package structure 200 is described as follows.

In the present invention, an insulating substrate, a leadframe, or a carrier substrate may serve as a substrate 212 depending on requirements. In this embodiment, the substrate 212 is the insulating substrate. A material of the insulating substrate is, for example, ceramic. However, this embodiment is not limited thereto. The insulating substrate may also be formed by other suitable insulating materials.

Figure 3:
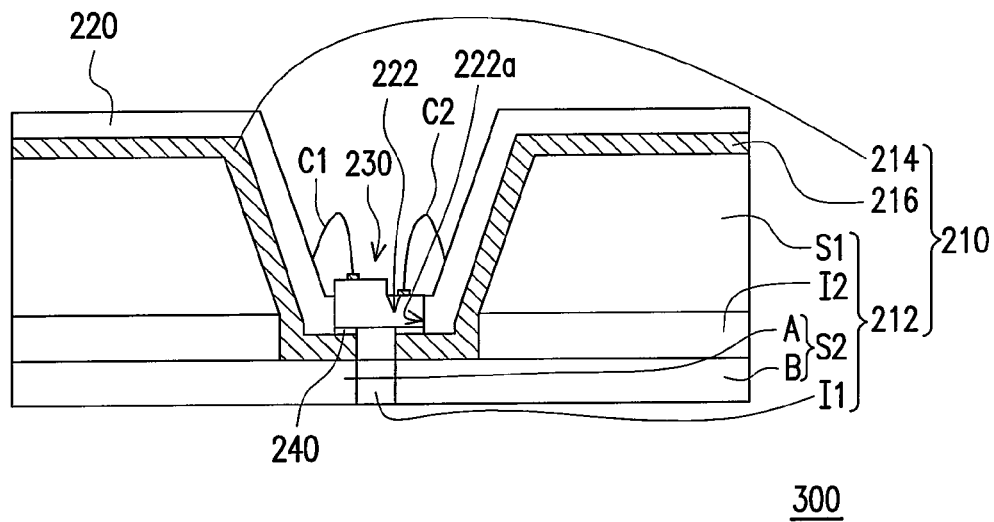
FIGS. 3~8 are schematic cross-sectional views depicting a variety of the light emitting diode package structure in FIG. 2.

FIGS. 3~8 are schematic cross-sectional views depicting a variety of the light emitting diode package structure in FIG. 2. Referring to FIG. 3, in this embodiment, a light emitting diode package structure 300 is similar to the light emitting diode package structure 200, and the difference lies in that the light emitting diode package structure 300 and the light emitting diode package structure 200 comprise different carriers 210. The carrier 210 of the light emitting diode package structure 300 may comprise the substrate 212, a first conductive structure 214, a second conductive structure 216. The LED chip 230 is disposed on the substrate 212, and the first conductive structure 214 and the second conductive structure 216 are respectively disposed on the substrate 212 on two sides of the LED chip 230.

Figure 4:
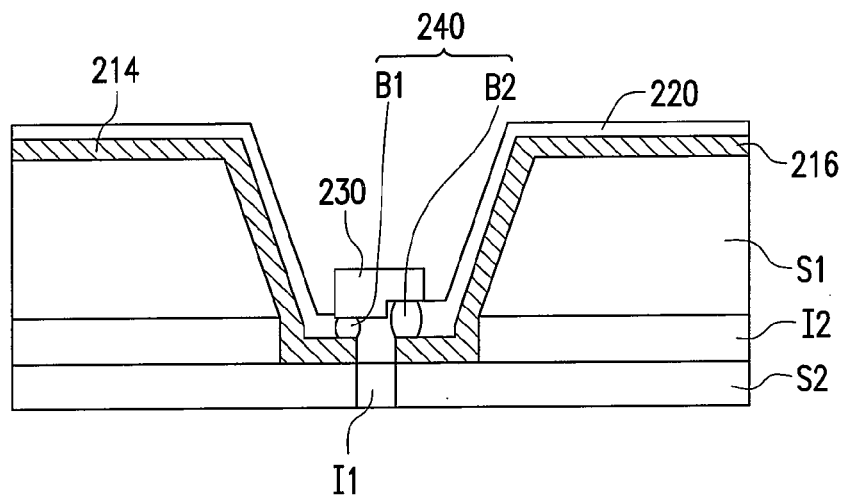

In this embodiment, the substrate 212 is, for example, a silicon-on-insulator (SOI). For instance, the substrate 212 comprises a first semiconductor layer S1, a second semiconductor layer S2, an insulating strip I1, and an insulating layer I2 arranged between the first semiconductor layer S1 and the second semiconductor layer S2. The insulating strip I1 is disposed in the second semiconductor layer S2 to divide the second semiconductor layer S2 into a first portion A and a second portion B. The first portion A is electrically connected with the first conductive structure 214, and the second portion B is electrically connected with the second conductive structure 216. Herein, a material of the first semiconductor layer S1 and the second semiconductor layer S2 is silicon, for example. A material of the insulating strip I1 and the insulating layer I2 is, for example, silicon oxide ($SiO_2$). In addition, the first conductive structure 214 and the second conductive structure 216 are electrically connected with the LED chip 230 respectively through a first conductive line C1 and a second conductive line C2. Referring to FIG. 4, in other embodiments, the adhesion layer 240 may comprise a first conductive bump B1 and a second conductive bump B2, and the first conductive structure 214 and the second conductive structure 216 are electrically connected with the LED chip 230 respectively through the first conductive bump B1 and the second conductive bump B2.

Figure 5:
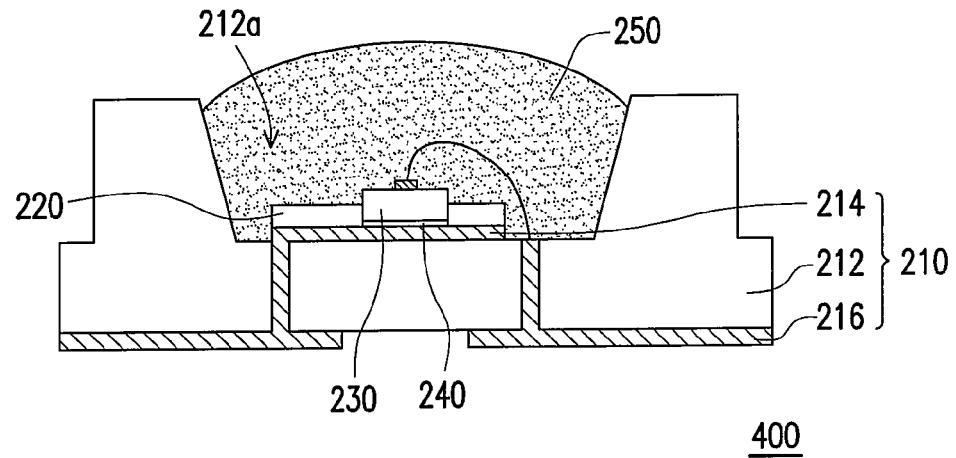

Referring to FIG. 5, in this embodiment, a light emitting diode package structure 400 is similar to the light emitting diode package structure 200, and the difference lies in that the light emitting diode package structure 400 and the light emitting diode package structure 200 comprise different carriers 210. In this embodiment, the substrate 212 of the carrier 210 comprises a recess 212a, and the LED chip 230 is disposed in the recess 212a on the substrate 212. Moreover, the light emitting diode package structure 200 further comprises a fluorescent material layer 250 disposed in the recess 212a to cover the LED chip 230.

Figure 6:
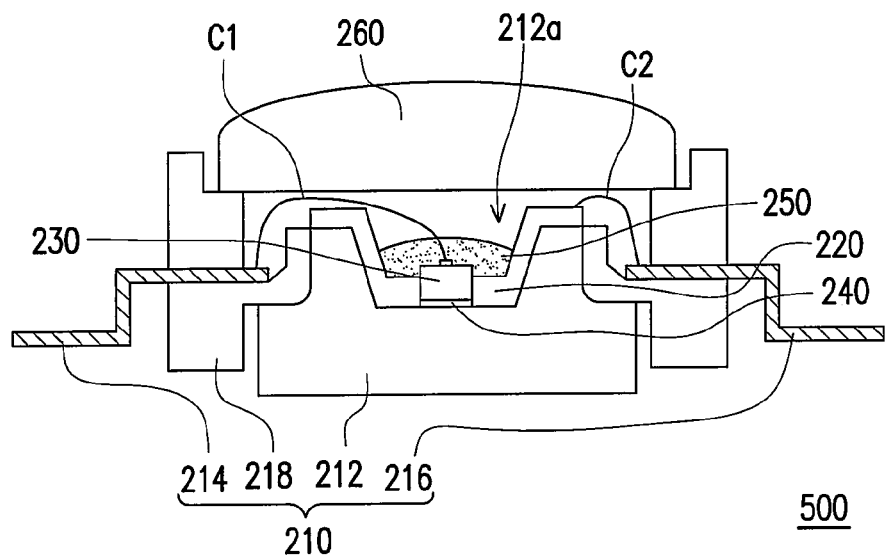

Referring to FIG. 6, in this embodiment, a light emitting diode package structure 500 is similar to the light emitting diode package structure 400, and the difference lies in that the light emitting diode package structure 500 and the light emitting diode package structure 400 comprise different carriers 210. In this embodiment, the carrier 210 further comprises a housing 218, and the first conductive structure 214 and the second conductive structure 216 respectively pass through the housing 218.

In this embodiment, the substrate 212 is formed by a conductive material, and the housing 218 is formed by an insulating material. The conductive material is, for example, copper, aluminum, or other suitable conductive materials. The LED chip 230 is electrically connected with the substrate 212 through the adhesion layer 240, and the substrate 212 is electrically connected with the second conductive structure 216 through the second conductive line C2. In addition, the LED chip 230 is electrically connected with the first conductive structure 214 through the first conductive line C1. Furthermore, the light emitting diode package structure 500 may comprise an optical lens 260 disposed on the recess 212a.

Figure 7:
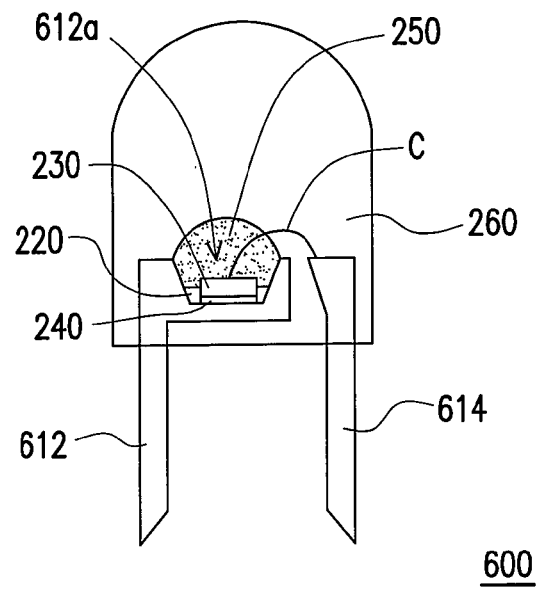

Referring to FIG. 7, in other embodiments, a carrier of a light emitting diode package structure 600 is, for example, a first leadframe 612 having a recess 612a. The LED chip 230 is disposed in the recess 612a and electrically connected with the first leadframe 612. In addition, the light emitting diode package structure 600 further comprises a second leadframe 614, a conductive line C, a molding compound 260, and a fluorescent material layer 250. Herein, the LED chip 230 is electrically connected with the second leadframe 614 through the conductive line C. The fluorescent material layer 250 is disposed in the recess 612a to cover the LED chip 230. Furthermore, the molding compound 260 covers the conductive line C.

Figure 8:
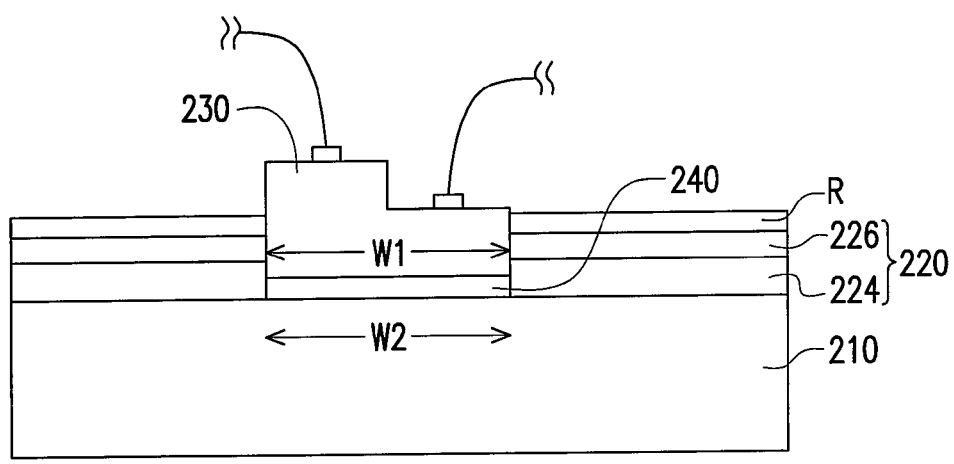

FIG. 8 is a schematic cross-sectional view depicting a light emitting diode package structure according to another embodiment of the present invention. Referring to FIG. 8, in other embodiments, a light emitting diode package structure 700 may further comprise a reflective layer R disposed on the first protrusion 220 depending on requirements. The first protrusion 220 comprises the first thermal-conductive material layer 224 and the second thermal-conductive material layer 226 arranged between the first thermal-conductive material layer 224 and the reflective layer R, wherein the first thermal-conductive material layer 224 is disposed on the carrier 210. The reflective layer R is adapted for reflecting a light generated by the LED chip 230 so as to increase light utilization. For instance, a material of the first thermal-conductive material layer 224 is copper, a material of the second thermal-conductive material layer 226 is nickel, and a material of the reflective layer R is sliver. In addition, this embodiment does not limit the number of the thermal-conductive material layers contained in the first protrusion 220. Therefore, the first protrusion 220 may comprise a thermal-conductive material layer or a plurality of thermal-conductive material layers.

Figure 9:
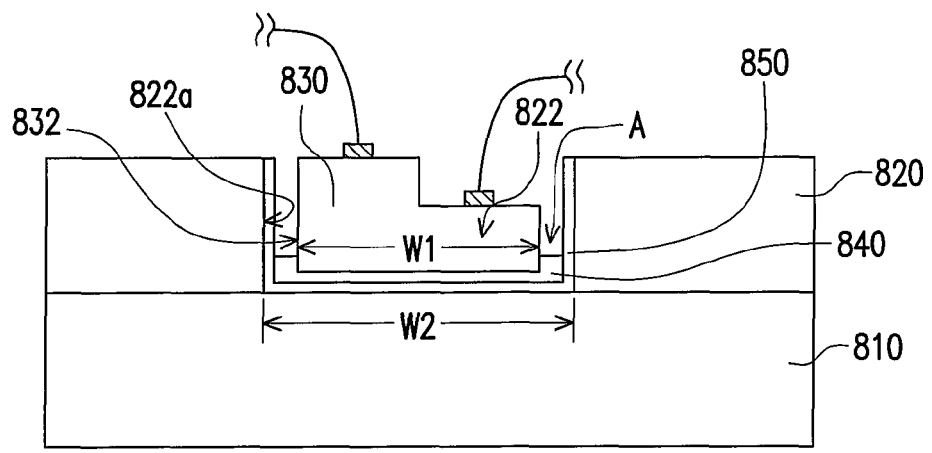
FIG. 9 is a schematic cross-sectional view depicting a light emitting diode package structure according to an embodiment of the present invention.

FIG. 9 is a schematic cross-sectional view depicting a light emitting diode package structure according to an embodiment of the present invention. Referring to FIG. 9, in this embodiment, a light emitting diode package structure 800 comprises a carrier 810, a first protrusion 820, a LED chip 830, and an adhesion layer 840. The first protrusion 820 is disposed on the carrier 810 and has a first opening 822 to expose the carrier 810. The first protrusion 820 is formed by a thermal conductive material. The LED chip 830 is disposed in the first opening 822 on the carrier 810. Moreover, a ratio between a width W2 of the first opening 822 and a width W1 of the LED chip 830 is larger than 1 and smaller than or equal to 1.5. Therefore, a gap A exists between a sidewall 832 of the LED chip 830 and an inner sidewall 822a of the first opening 822. The adhesion layer 840 is arranged between the LED chip 830 and the carrier 810 to bond the LED chip 830 to the carrier 810.

In this embodiment, the first protrusion 820 and the carrier 810 are, for example, formed in one piece. The first protrusion 820 and the carrier 810 may be formed by the same material (e.g. a thermal conductive material). Because the first protrusion 820 and the carrier 810 are formed in one piece and formed by the same material, heat generated by the LED chip 830 is rapidly transferred to the carrier 810 through the first protrusion 820. Consequently, the light emitting diode package structure 800 has better heat dissipation.

Furthermore, in this embodiment, a portion of the adhesion layer 840 may be disposed in the gap A depending on requirements. Hence, the adhesion layer 840 not only bonds the LED chip 830 to the carrier 810 but also bonds the LED chip 830 to the first protrusion 820. As a consequence, the LED chip 830 and the first protrusion 820 are steadily bonded. In addition, the heat generated by the LED chip 830 is transferred to the first protrusion 820 through the adhesion layer 840.

Depending on requirements, the light emitting diode package structure 800 may further comprise a first optical material layer 850 disposed on the inner wall 822a of the first opening 822 and on the carrier 810 exposed by the first opening 822. The first optical material layer 850 may be a reflective layer or a light absorption layer. If the first optical material layer 850 is a reflective layer, the reflective layer is adapted for reflecting a light, which is emitted from the LED chip 830 to the inner wall 822a of the first opening 822 and the carrier 810 exposed by the first opening 822, so as to enhance light utilization. If the first optical material layer 850 is a light absorption layer, the light absorption layer is adapted for absorbing a light, which is emitted from the LED chip 830 to the inner wall 822a of the first opening 822 and the carrier 810 exposed by the first opening 822, so as to unify a direction of the light emitted by the light emitting diode package structure 800. A variety of the light emitting diode package structure 800 is described as follows.

Figure 10:
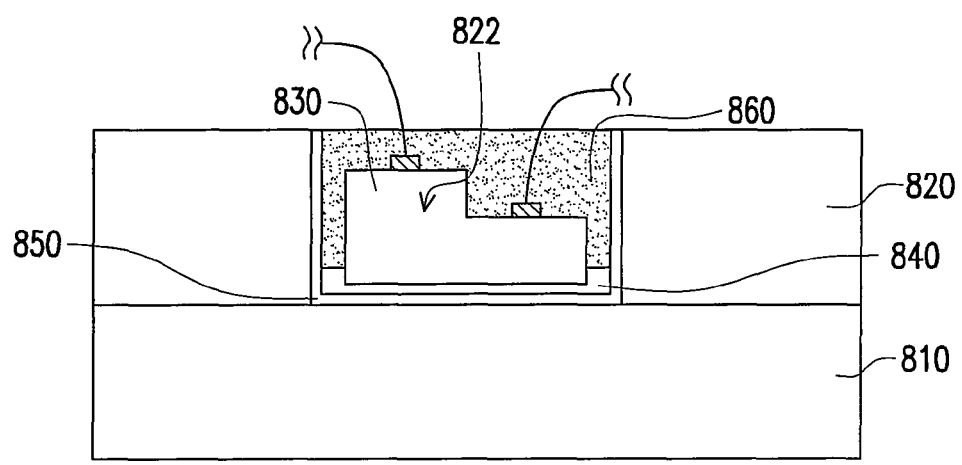
FIG. 10 is a schematic cross-sectional view depicting a light emitting diode package structure according to another embodiment of the present invention.

FIG. 10 is a schematic cross-sectional view depicting a light emitting diode package structure according to another embodiment of the present invention. Referring to FIG. 10, a light emitting diode package structure 900 may further comprise a first fluorescent material layer 860 disposed in the first opening 822 depending on requirements. Moreover, in other embodiments, the light emitting diode package structure further comprises a transparent material layer disposed in the first opening of the first protrusion.

Figure 11:
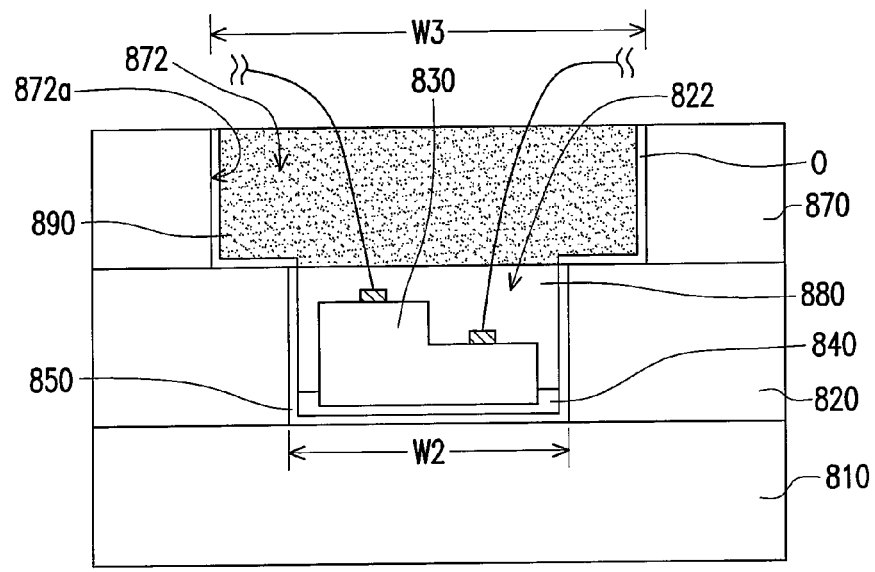
FIG. 11 is a schematic cross-sectional view depicting a light emitting diode package structure according to yet another embodiment of the present invention.

FIG. 11 is a schematic cross-sectional view depicting a light emitting diode package structure according to yet another embodiment of the present invention. Referring to FIG. 11, a light emitting diode package structure 1000 may further comprise a second protrusion 870 disposed on the first protrusion 820. The second protrusion 870 has a second opening 872, and the second opening 872 is connected with the first opening 822. A width W3 of the second opening 872 is larger than a width W2 of the first opening 822. In this embodiment, it is noted that the width W2 of the first opening 822 and the width W3 of the second opening 872 are referred in the same cross-section.

In this embodiment, the carrier 810, the first protrusion 820, and the second protrusion 870 may be formed in one piece and formed by the same material. In addition, the light emitting diode package structure 1000 may further comprise a second fluorescent material layer 890 disposed in the second opening 872. The second fluorescent material layer 890 has a uniform thickness, and therefore the light emitting diode package structure 1000 emits a light with uniform color.

In this embodiment, the light emitting diode package structure 1000 may further comprise a transparent material layer 880 disposed in the first opening 822. Herein, the transparent material layer 880 is formed by a suitable transparent material, such as epoxy resin or silicon resin. The light emitting diode package structure 1000 may further comprise a second optical material layer O disposed on an inner wall 872a of the second opening 872. The second optical material layer O may be a reflective layer or a light absorption layer. If the second optical material layer O is a reflective layer, the reflective layer is adapted for reflecting a light emitted from the LED chip 830 to the inner wall 872a of the second opening 872, so as to enhance light utilization. If the second optical material layer O is a light absorption layer, the light absorption layer is adapted for absorbing a light emitted from the LED chip 830 to the inner wall 872a of the second opening 872, so as to unify a direction of the light emitted by the light emitting diode package structure 1000.

Figure 12:
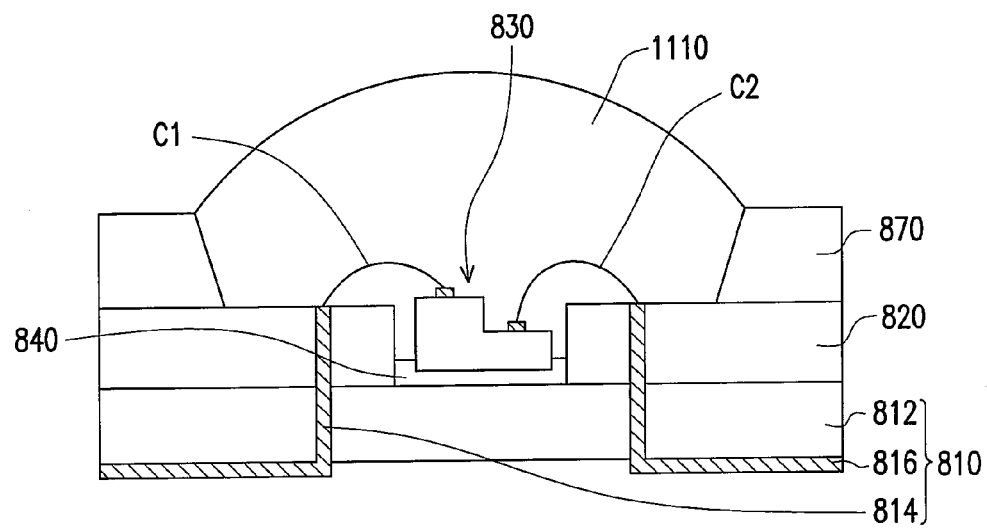
FIG. 12 is a schematic cross-sectional view depicting a variety of the light emitting diode package structure in FIG. 11.

FIG. 12 is a schematic cross-sectional view depicting a variety of the light emitting diode package structure in FIG. 11. Referring to FIG. 12, a light emitting diode package structure 1100 in this embodiment is similar to the light emitting diode package structure 1000 in FIG. 11. The difference lies in that the carrier 810 in this embodiment comprises the substrate 812, the first conductive structure 814, and the second conductive structure 816. Furthermore, the first conductive structure 814 and the second conductive structure 816 respectively pass through the substrate 812 and the first protrusion 820. In this embodiment, the substrate 812 and the first protrusion 820 are formed by an insulating material. The LED chip 830 is electrically connected with the first conductive structure 814 and the second conductive structure 816 respectively through the first conductive line C1 and the second conductive line C2.

FIGS. 13A~13D are schematic cross-sectional views depicting a process flow for fabricating a light emitting diode package structure according to an embodiment of the present invention. First, referring to FIG. 13A, a substrate 1310 having a first surface 1312 is provided. In the meantime, a surface treatment process may be performed on the first surface 1312 of the substrate 1310. The surface treatment process is, for example, adapted for forming a first thermal-conductive material layer on the first surface 1312 or increasing adhesion between the first thermal-conductive material layer and the substrate 1310.

Figure 13A:
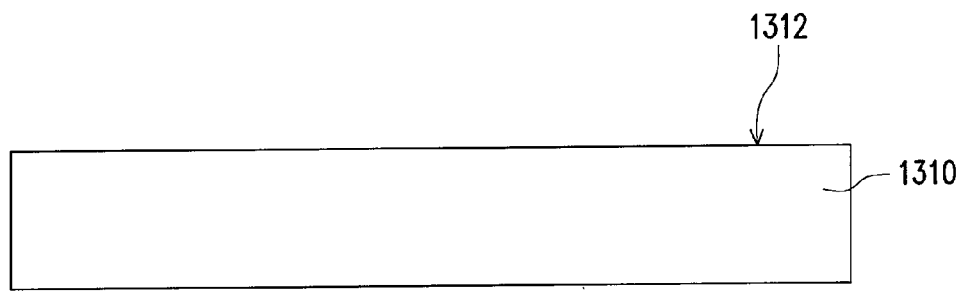
FIGS. 13A~13D are schematic cross-sectional views depicting a process flow for fabricating a light emitting diode package structure according to an embodiment of the present invention.
Figure 13B:
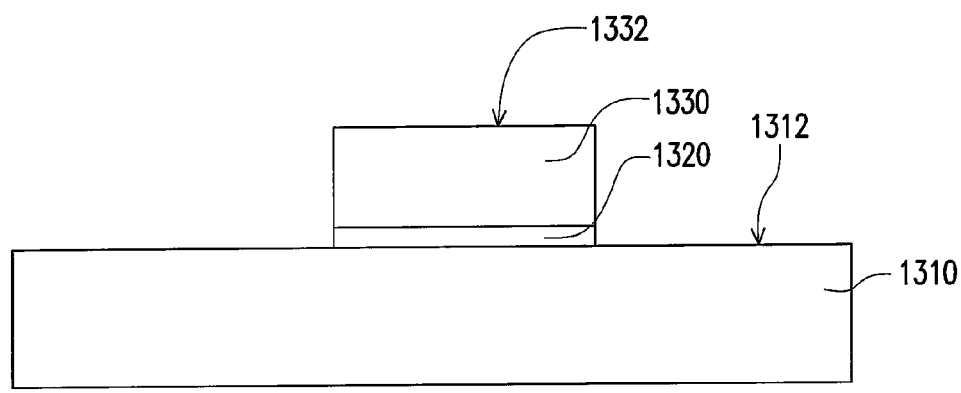

Then, referring to FIG. 13B, an adhesion layer 1320 and a LED chip 1330 are disposed on the first surface 1312 of the substrate 1310. Herein, the adhesion layer 1320 is bonded between the LED chip 1330 and the substrate 1310, and the LED chip 1330 has a second surface 1332 away from the substrate 1310.

Figure 13C:
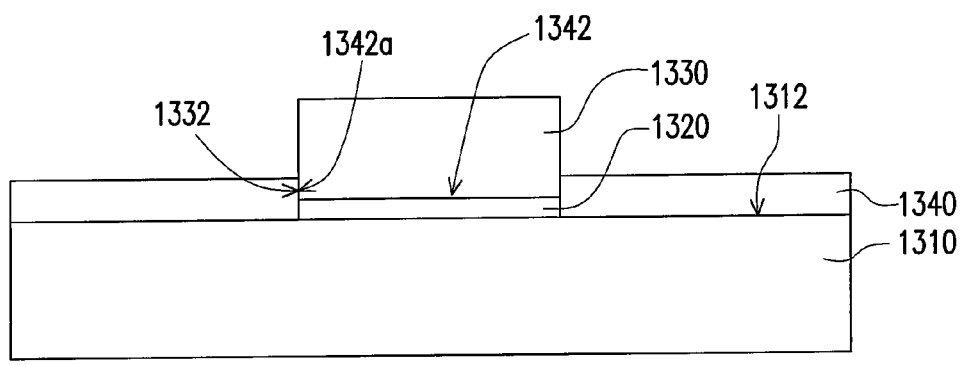

Thereafter, referring to FIG. 13C, a first thermal-conductive material layer 1340 is formed on the first surface 1312. The first thermal-conductive material layer 1340 has a first opening 1342 to expose the LED chip 1330, and an inner sidewall 1342a of the first opening 1342 is attached to a sidewall 1332 of the LED chip 1330. In this embodiment, a method for forming the first thermal-conductive material layer 1340 comprises electroless plating, electroplating, electrophoresis, electrodeposition, or a combination of the above. Moreover, in other embodiments not illustrated here, a method for forming the first thermal-conductive material layer further comprises disposing a bonding layer and a thermal conductive element on the first surface of the substrate, wherein the bonding layer is bonded between the substrate and the thermal conductive element.

Figure 13D:
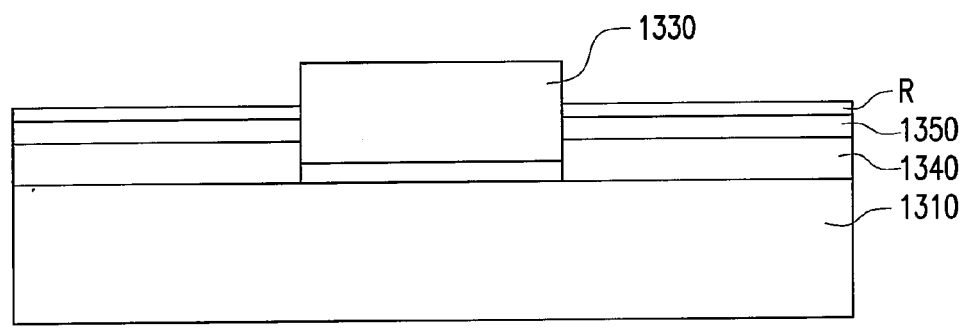

In this embodiment, referring to FIG. 13D, a second thermal-conductive material layer 1350 is formed on the first thermal-conductive material layer 1340 after the first thermal-conductive material layer 1340 is formed. Furthermore, in this embodiment, a reflective layer R may be formed on the second thermal-conductive material layer 1350 after the second thermal-conductive material layer 1350 is formed. Herein, a material of the first thermal-conductive material layer 1340 is copper, a material of the second thermal-conductive material layer 1350 is nickel, and a material of the reflective layer R is sliver.

Figure 14A:
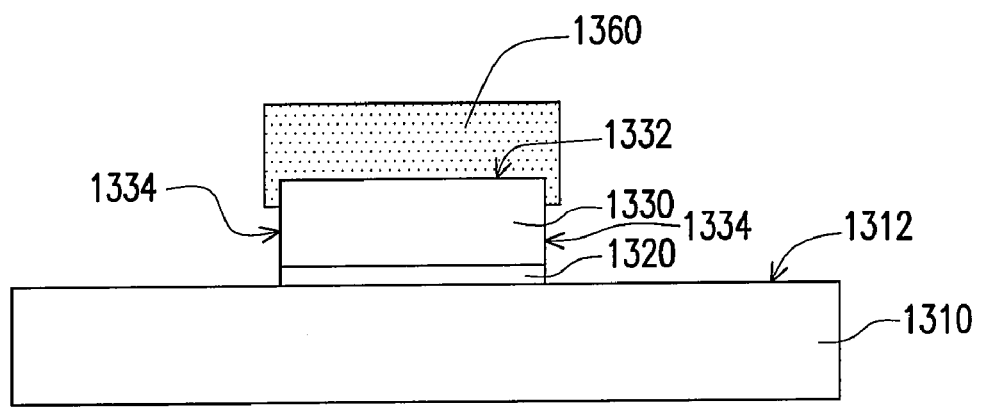
FIGS. 14A~14C are schematic cross-sectional views depicting a process flow for fabricating a light emitting diode package structure according to another embodiment of the present invention.
Figure 14B:
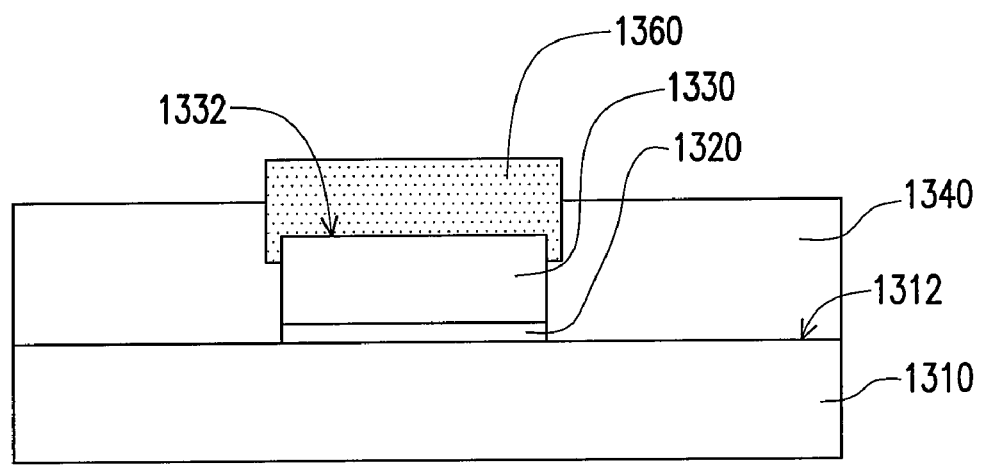
Figure 14C:
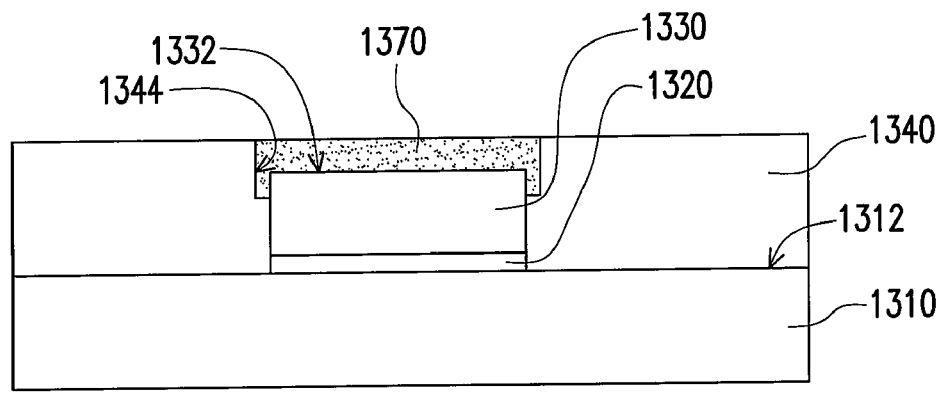

FIGS. 14A~14C are schematic cross-sectional views depicting a process flow for fabricating a light emitting diode package structure according to another embodiment of the present invention. The fabricating process flow in this embodiment is similar to the fabricating process flow illustrated in FIGS. 13A~13D.

Referring to FIG. 14A, the difference lies in that this embodiment further comprises forming a shielding layer 1360 on the second surface 1332 and on a portion of the sidewall 1334 of the LED chip 1330, before forming the first thermal-conductive material layer and after disposing the adhesion layer 1320 and the LED chip 1330 on the first surface 1312 of the substrate 1310. Then, referring to FIG. 14B, the first thermal-conductive material layer 1340 is formed on the first surface 1312. Thereafter, referring to FIG. 14C, the shielding layer 1360 is removed. A recess 1344 is formed in the first thermal-conductive material layer 1340 after removing the shielding layer 1360 and a fluorescent material layer 1370 is formed in the recess 1344.

Figure 15A:
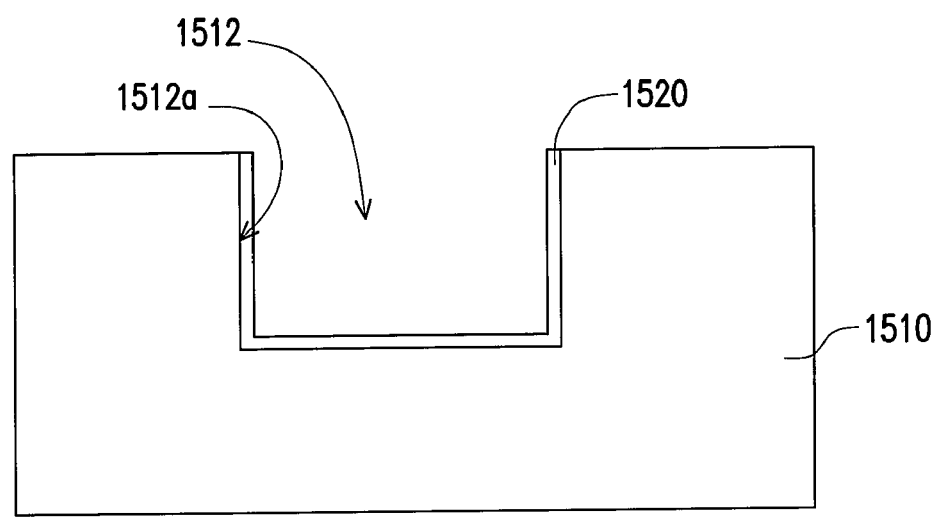
FIGS. 15A~15C are schematic cross-sectional views depicting a process flow for fabricating a light emitting diode package structure according to an embodiment of the present invention.
Figure 15B:
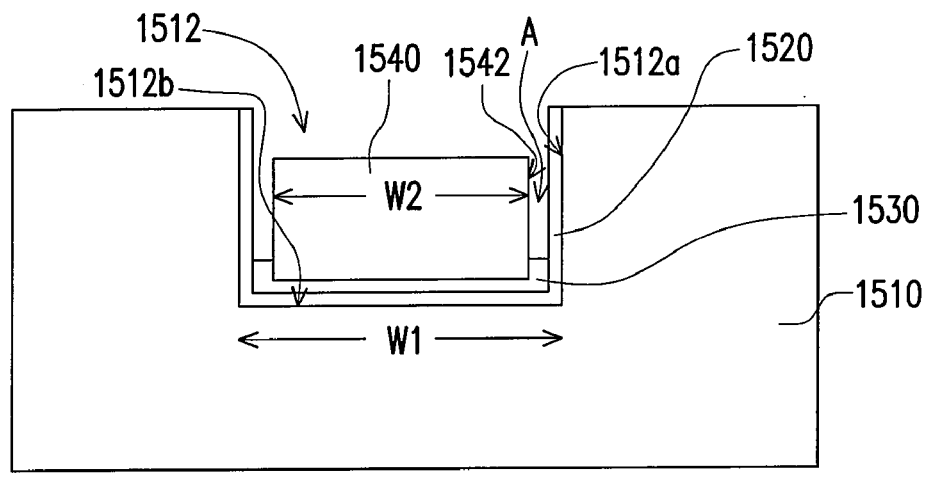
Figure 15C:
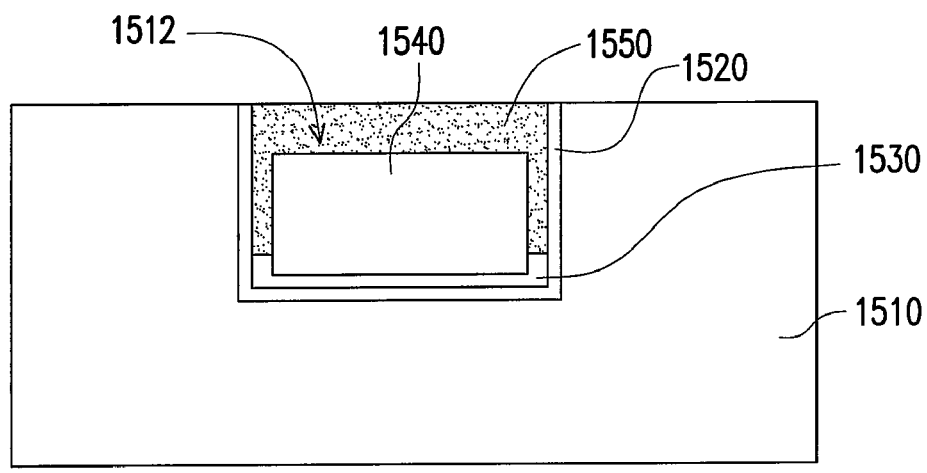

FIGS. 15A~15C are schematic cross-sectional views depicting a process flow for fabricating a light emitting diode package structure according to an embodiment of the present invention. First, referring to FIG. 15A, a substrate 1510 having a recess 1512 is provided. In this embodiment, an optical material layer 1520 may also be formed on an inner wall 1512a of the recess 1512. The optical material layer 1520 is, for example, a reflective layer, a light absorption layer, or other suitable optical material layers.

Then, referring to FIG. 15B, the adhesion layer 1530 and the LED chip 1540 are disposed on a bottom 1512b of the recess 1512, and the adhesion layer 1530 is bonded between the substrate 1510 and the LED chip 1540. A ratio between a width W1 of the recess 1512 and a width W2 of the LED chip 1540 is larger than 1 and smaller than or equal to 1.5 such that a gap A exists between a sidewall 1542 of the LED chip 1540 and the inner wall 1512a of the recess 1512. Further referring to FIG. 15C, in this embodiment, a fluorescent material layer 1550 may be formed in the recess 1512.

To sum up, the light emitting diode package structure of the present invention has at least the following advantages:

1. The light emitting diode package structure of the present invention comprises the first protrusion formed by a thermal conductive material, and the first protrusion is attached to the sidewall of the LED chip. Hence, the first protrusion of the present invention is adapted for enhancing thermal conduction efficiency of the sidewall of the LED chip. Consequently, the first protrusion helps the light emitting diode package structure to prevent reducing light emitting efficiency or damaging the LED chip.
2. Compared with a conventional carrier, the first protrusion of the present invention is closer to the light emitting layer of the LED chip. Therefore, the first protrusion helps to rapidly remove the heat generated by the light emitting layer of the LED chip.
3. The first protrusion and the carrier of the present invention are formed in one piece and formed by the same material. As a consequence, the heat generated by the LED chip is rapidly transferred to the carrier through the first protrusion, so as to achieve better heat dissipation of the light emitting diode package structure.
4. The adhesion layer of the present invention not only bonds the LED chip to the carrier but also bonds the LED chip to the first protrusion. Consequently, the LED chip and the first protrusion are steadily bonded. In addition, the heat generated by the LED chip is transferred to the first protrusion and the carrier through the adhesion layer.
5. The second fluorescent material layer of the present invention has a uniform thickness, and therefore a light emitted by the light emitting diode package structure has uniform color.

Although the present invention has been disclosed by the above preferable embodiments, they are not intended to limit the present invention. Persons skilled in this art may make some modifications without departing from the spirit and scope of the present invention. Therefore, the protection range of the present invention falls in the appended claims.

What is claimed is:

1. A light emitting diode (LED) package structure, comprising:
    a carrier;
    a first protrusion on the carrier and having a first opening to expose the carrier, and the first protrusion comprising a thermal conductive material;
    a LED chip disposed in the first opening on the carrier, and a ratio between a width of the first opening and a width of the LED chip being larger than 1 and smaller than or equal to 1.5 such that a gap existing between a sidewall of the LED chip and an inner sidewall of the first opening; and
    an adhesion layer disposed between the LED chip and the carrier to bond the LED chip to the carrier.

2. The LED package structure as claimed in claim 1, wherein the first protrusion and the carrier are integrally formed.

3. The LED package structure as claimed in claim 1, wherein a portion of the adhesion layer is disposed in the gap.

4. The LED package structure as claimed in claim 1, further comprising a first optical material layer, and the first optical material layer being disposed on the inner sidewall of the first opening and the carrier exposed by the first opening.

5. The LED package structure as claimed in claim 4, wherein the first optical material layer is a reflective layer or a light absorption layer.

6. The LED package structure as claimed in claim 1, further comprising a first fluorescent material layer disposed in the first opening.

7. The LED package structure as claimed in claim 1, further comprising a transparent material layer disposed in the first opening.

8. The LED package structure as claimed in claim 1, further comprising a second protrusion disposed on the first protrusion and having a second opening, and the second opening being connected with the first opening and having a width larger than a width of the first opening.

9. The LED package structure as claimed in claim 8, wherein the carrier, the first protrusion, and the second protrusion are integrally formed.

10. The LED package structure as claimed in claim 8, further comprising a second fluorescent material layer disposed in the second opening.

11. The LED package structure as claimed in claim 8, further comprising a second optical material layer disposed on an inner sidewall of the second opening.

12. The LED package structure as claimed in claim 11, wherein the second optical material layer is a reflective layer or a light absorption layer.

13. A light emitting diode (LED) package structure, comprising:
    a carrier;
    a first protrusion on the carrier and having a first opening to expose the carrier, and the first protrusion comprising a thermal conductive material;
    a LED chip disposed in the first opening on the carrier, and a ratio between a width of the first opening and a width of the LED chip being between 1 and 1.5; and
    an adhesion layer disposed between the LED chip and the carrier to bond the LED chip to the carrier.

* * * * *